United States Patent
Mills et al.

(10) Patent No.: US 8,975,914 B2
(45) Date of Patent: Mar. 10, 2015

(54) ISOLATION RECEIVER

(75) Inventors: Michael Mills, Austin, TX (US); Jing Li, Austin, TX (US); Riad Samir Wahby, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 266 days.

(21) Appl. No.: 13/602,905

(22) Filed: Sep. 4, 2012

(65) Prior Publication Data

US 2014/0062527 A1 Mar. 6, 2014

(51) Int. Cl.
*H03B 1/00* (2006.01)
*H03K 3/00* (2006.01)
*H03K 19/003* (2006.01)
*H01P 1/00* (2006.01)

(52) U.S. Cl.
CPC ................... *H03K 19/003* (2013.01)
USPC .............. 326/21; 327/108; 327/427; 333/247

(58) Field of Classification Search
USPC ........ 326/21, 22, 82; 327/108, 427, 111, 205; 333/247; 330/10, 207
See application file for complete search history.

(56) References Cited

U.S. PATENT DOCUMENTS

| | | | | |
|---|---|---|---|---|
| 4,748,419 | A * | 5/1988 | Somerville | 330/10 |
| 7,741,896 | B2 * | 6/2010 | Chow et al. | 327/427 |
| 8,188,814 | B2 * | 5/2012 | Ng et al. | 333/247 |
| 8,451,032 | B2 * | 5/2013 | Dong et al. | 327/108 |

OTHER PUBLICATIONS

Jacob Millman et al., Second Edition Microelectronics, McGraw Hill, pp. 760-763, 1987.

* cited by examiner

*Primary Examiner* — Daniel D Chang
(74) *Attorney, Agent, or Firm* — Trop, Pruner & Hu, P.C.

(57) ABSTRACT

An isolation receiver includes at least one isolation capacitor to provide a first logic signal in response to a second logic signal that is provided by a transmitter. The receiver includes a signal processing circuit to amplify the first logic signal to generate an amplified signal, and the signal processing circuit includes a an amplifier to apply a nonlinear function. A comparator of the receiver provides a third logic signal in response to the amplified signal.

19 Claims, 5 Drawing Sheets

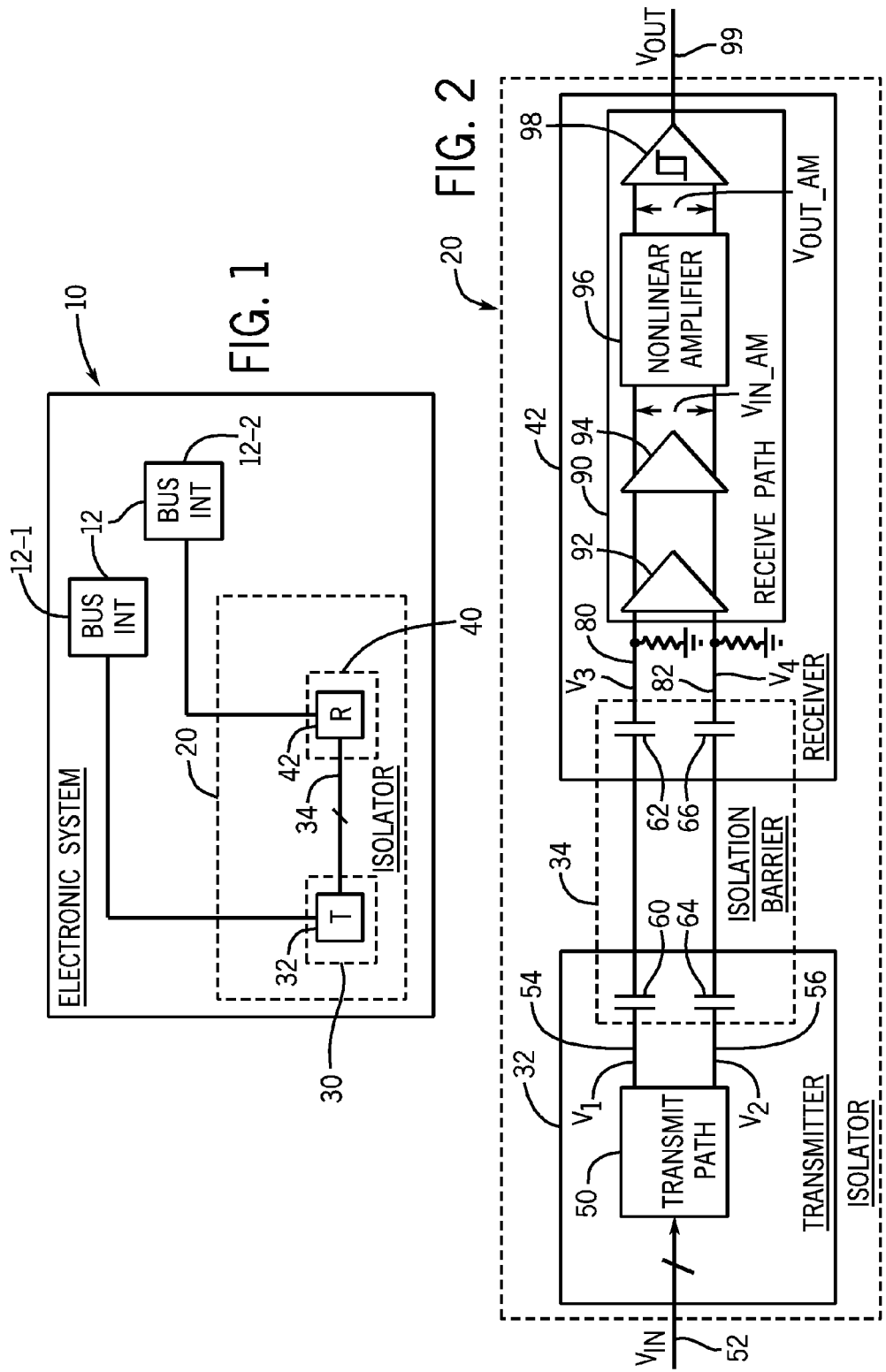

ISOLATION RECEIVER

BACKGROUND

Galvanic isolation typically is employed for purposes of isolating circuits powered from different sources. More specifically, two electrical circuits that electrically communicate with each other may have different ground potentials. The isolation prevents ground loops and may protect users of the circuits from potentially hazardous voltages due to the different ground potentials.

One form of galvanic isolation uses magnetic flux coupling, such as the coupling that occurs between primary and secondary windings of a magnetic transformer. Another type of galvanic isolation uses optical coupling that allows otherwise isolated circuits to communicate using light waves. Capacitive coupling may also be used to galvanically isolate two circuits. In this manner, capacitors allow alternating current (AC) to be communicated between the circuits while blocking direct current (DC), thereby allowing the circuits to operate at different ground potentials or from different power sources.

SUMMARY

In an example embodiment, an isolation receiver includes at least one isolation capacitor to provide a first logic signal in response to a second logic signal that is provided by a transmitter. The receiver includes a signal processing circuit to apply a nonlinear function to the first logic signal to generate a transformed signal. A comparator of the receiver provides a second logic signal in response to the transformed signal.

In another example embodiment, a technique includes receiving a first logic signal from at least one isolation capacitor, the first signal being indicative of logical transitions of a second logic signal provided to the isolation capacitor(s) by a transmitter. The technique includes applying a nonlinear gain function to the first logic signal to generate a transformed signal using an amplifier signal generating another logic signal in response to the transformed signal.

In yet another example embodiment, an apparatus includes an integrated circuit that includes at least one galvanic isolation capacitor, an amplifier and a comparator. The isolation capacitor(s) provide a first signal indicative of logical transitions of a second signal. The amplifier is adapted to apply a nonlinear function to the first signal.

Advantages and other desired features will become apparent from the following drawings, description and claims.

BRIEF DESCRIPTION OF THE DRAWINGS

FIG. 1 is a schematic diagram of an electronic system, which uses a capacitor-based isolation barrier to galvanically isolate circuits of the system according to an exemplary embodiment.

FIG. 2 is a schematic diagram of an isolator of FIG. 1 formed from a transmitter and a receiver that communicate with each other across a capacitor-based isolation barrier according to an exemplary embodiment.

DETAILED DESCRIPTION

Figure 3:
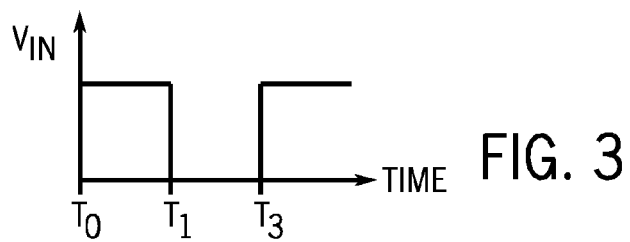
FIGS. 3, 4, 5, 6, 7 and 8 are waveforms illustrating communication across the capacitor-based isolation barrier of FIG. 2 according to an exemplary embodiment.

Referring to FIG. 1, in accordance with exemplary embodiments, systems and techniques are disclosed to galvanically isolate two circuits, while allowing the circuits to communicate with each other. Such isolation allows the circuits to maintain separate power systems or sources (and therefore, have different ground potentials), which promotes ground loop safety, protects users of the circuits and ensures reliable communications between the circuits when the circuits are in a "harsh" environment (an environment that subjects the circuits to relatively high noise floors, surges, electromagnetic fields, and so forth).

As a more specific example, FIG. 1 depicts an example system 10 that includes bus interfaces 12, which communicate through and are galvanically isolated from each other by a capacitor-based isolator 20. As a non-limiting example, the bus interfaces 12 may be interintegrated component ($I^2C$) or system management bus (SMBus) bus devices, in accordance with some embodiments. Other buses or interconnects, whether serial or parallel, may be used in other embodiments, as persons of ordinary skill in the art understand.

In general, the isolator 20 includes transmitters and receivers that communicate with each other across or over capacitor-based isolation barriers. The isolation barriers isolate the direct current (DC) voltages and currents of the bus interfaces 12 from each other, while, allowing the communication of AC currents and voltages to thereby permit signal communications between the bus interfaces 12.

For the example that is depicted in FIG. 1, a transmitter 32 of the isolator 20, which is coupled to an exemplary bus interface 12-1 communicates with a receiver 42 of the isolator 20, which is coupled to another bus interface 12-2 over an isolation barrier 34. It is noted that FIG. 1 is a simplified representation, as the isolator 20 may contain multiple transmitters, receivers and isolation barriers 34, in accordance with some embodiments. Moreover, a given bus interface 12 may use multiple receivers and multiple transmitters of the isolator 10, in accordance with some embodiments.

In accordance with some embodiments, the transmitter 32 and at least part of the isolation barrier 34 may be part of an integrated circuit 30 that is separate from an integrated circuit 40 on which the receiver 42 and at least another part of the isolation barrier 34 are disposed. In accordance with some embodiments, the transmitter 32 may be disposed on a separate die than the receiver 42; and the separate dies may be part of the same semiconductor package or may be contained in separate semiconductor packages. Thus, many variations are contemplated, which are within the scope of the appended claims.

In general, the capacitor-based isolation barrier 34 that galvanically isolates the transmitter 30 from the receiver 42, while allowing signals to be communicated between the transmitter 30 and receiver 42

As a more specific example, FIG. 2 depicts the isolator 20 in accordance with some embodiments. For this example, the transmitter 32 includes a transmit path 50, which receives an input logic signal (called "$V_{IN}$" in FIG. 2) at its input terminal(s) 52. The $V_{IN}$ signal may be, for example, provided by the bus interface 12-1 of FIG. 1. The $V_{IN}$ signal, in accordance with example embodiments, is a level-based logic signal in that the level, or magnitude, of the signal represents either a logic one (a relatively "high" voltage magnitude, for example) or a logic zero (a relatively "low" voltage magnitude).

The transmit path 50 contains signal conditioning circuitry (formed from one or more low noise amplifiers, drivers, and so forth) that produces a differential output signal across output terminals 54 and 56 of the transmitter 32 in response to the $V_{IN}$ signal. More specifically, in accordance with example embodiments, the transmitter 32 provides two output signals (called "$V_1$" and "$V_2$" in FIG. 2) that appear on the output terminals 54 and 56, respectively.

The isolation barrier 34 couples the output terminals 54 and 56 of the transmitter 32 to input terminals 80 and 82, respectively, of the receiver 42. More specifically, in accordance with some embodiments, the isolation barrier 34 includes capacitors 60 (part of the transmitter 32) and 62 (part of the receiver 42), which are coupled in series between the output terminal 54 of the transmitter 32 and the input terminal 80 of the receiver 42. The isolation barrier 34 further includes capacitors 64 (part of the transmitter 32) and 66 (part of the receiver 42) that are coupled in series between the output terminal 56 of the transmitter 32 and the input terminal 82 of the receiver 32. As depicted in FIG. 2, the input terminal 80 receives a signal called "$V_3$," and the input terminal 82 receives a signal called "$V_4$."

In accordance with example embodiments that are disclosed herein, the $V_1$-$V_2$ differential signal represents a logic one when the $V_1$-$V_2$ differential signal has a magnitude that exceeds a predetermined logic one voltage level, and the $V_1$-$V_2$ differential signal represents a logic zero when the $V_1$-$V_2$ differential signal has a magnitude that is below a lower, predetermined logic zero voltage level.

The isolation barrier 34 converts the logic level-based $V_1$-$V_2$ differential signal into the $V_3$-$V_4$ differential signal, which, according to some embodiments, contains pulses that correspond to rising and falling edges of the $V_1$-$V_2$ differential signal. For example, in accordance with some embodiments, positive pulses of the $V_3$-$V_4$ differential signal correspond to rising edges of the $V_1$-$V_2$ differential signal; and the timing of the positive pulses correspond to the timing of corresponding rising edges. The negative pulses of the $V_3$-$V_4$ differential signal represent falling edges of the $V_1$-$V_2$ differential signal; and the timing of the negative pulses represent the timing of the corresponding falling edges. In other embodiments, the positive pulses of the $V_3$-$V_4$ differential signal may correspond to falling edges, and the negative pulses of the $V_3$-$V_4$ differential signal may correspond to rising edges.

Figure 4:
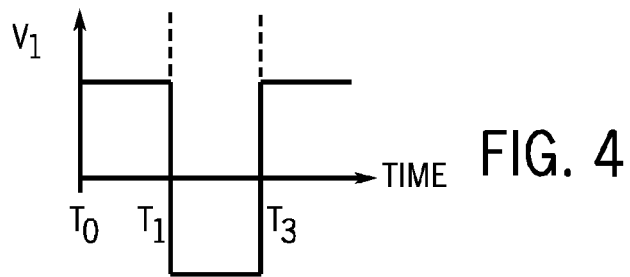
Figure 5:
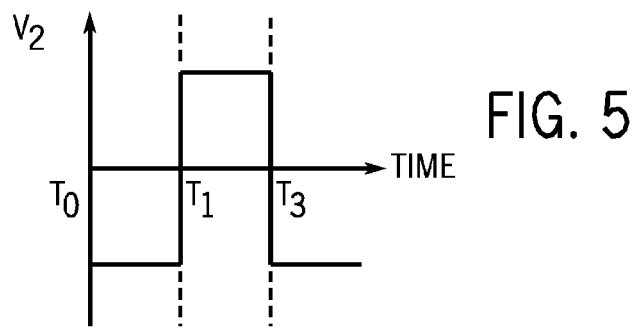

As a more specific example, referring to FIGS. 3, 4 and 5 in conjunction with FIG. 2, in accordance with exemplary embodiments, the transmit path 50 receives the $V_{IN}$ input signal, which, for this example, has a logic one value from time $T_0$ to time $T_1$, which causes the transmit path 50 to assert the $V_1$ signal and de-assert the $V_2$ signal from time $T_0$ to time $T_1$. The logic level of the $V_{IN}$ input signal, for this example, transitions at time $T_1$ to a logic zero state and transitions at time $T_3$ to a logic one value. The $V_1$ and $V_2$ signals likewise follow these changes. Thus, logic edges appear in the $V_{IN}$ signal at times $T_1$ and $T_3$ for this example and cause corresponding logic transitions in the $V_1$ and $V_2$ signals: at time $T_1$, the $V_{IN}$ signal has a falling edge, and at time $T_3$, the $V_{IN}$ signal has a rising edge.

Figure 6:
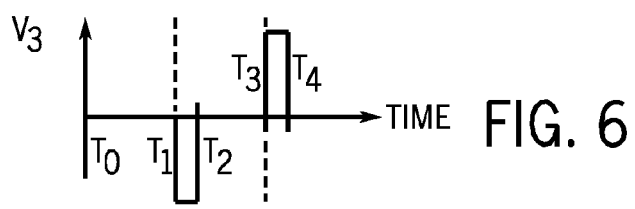
Figure 7:
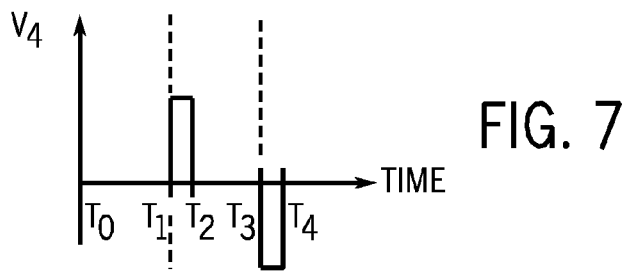

The falling and rising edges of the $V_1$-$V_2$ differential signal produce corresponding pulses in the $V_3$-$V_4$ differential signal. In this manner, referring to FIGS. 3, 6 and 7 in conjunction with FIG. 2, the $V_3$ signal is pulsed low and the $V_4$ signal is pulsed high from time $T_1$ to time $T_2$, in response to the falling edge of the $V_{IN}$ signal at time $T_1$ (thereby producing a negative pulse in the $V_3$-$V_4$ differential signal); and the $V_3$ signal is pulsed high and the $V_4$ signal is pulsed low from time $T_3$ to time $T_4$, in response to the rising edge of the $V_{IN}$ signal at time $T_3$ (thereby producing a positive pulse in the $V_3$-$V_4$ differential signal).

Figure 8:
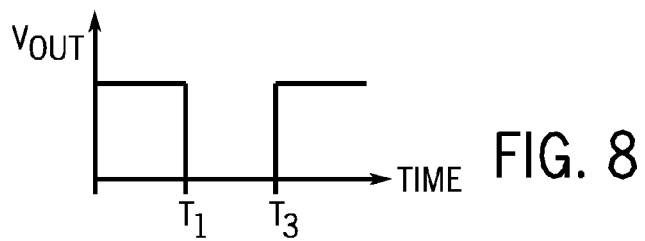

Referring back to FIG. 2, in general, the receive path 90 converts the pulses that are received at its input terminals 80 and 82 into an output signal (called "$V_{OUT}$" in FIG. 2). For the example signals described above, the receive path 90 generates the $V_{OUT}$ signal that is depicted in FIG. 8 and has logic levels that, in general, correspond to the logic levels of the $V_{IN}$ signal.

In accordance with some embodiments, the receive path 90 includes linear amplifiers, such as a first stage low noise amplifier (LNA) 92 and a second stage LNA 94; a nonlinear amplifier 96; and a comparator 98 (a hysteresis-based comparator, such as a Schmitt trigger, for example, in exemplary embodiments) that provides the $V_{OUT}$ signal at an output terminal 99.

In general, the receive path 90 converts the pulses of the $V_3$-$V_4$ differential signal into the $V_{OUT}$ signal while maintaining a sufficiently high signal-to-noise ratio (SNR) and common mode transient immunity (CMTI). In general, the first stage LNA 92 amplifies the $V_3$-$V_4$ differential signal to provide a degree of common mode signal suppression. The second stage LNA 94 buffers and amplifies the differential signal that is provided by the first stage LNA 92 to provide a degree of additional common mode signal suppression.

In accordance with embodiments disclosed herein, the nonlinear amplifier 96 is disposed in the receive path 90 to apply a nonlinear function for purposes of introducing a nonlinear gain. The non-linear gain improves the SNR and more specifically, boosts the SNR of the incoming signal while providing common mode signal suppression as the strong non-linearity aids in attenuating the common mode transient signals to enhance the isolator's CMTI.

Figure 9:
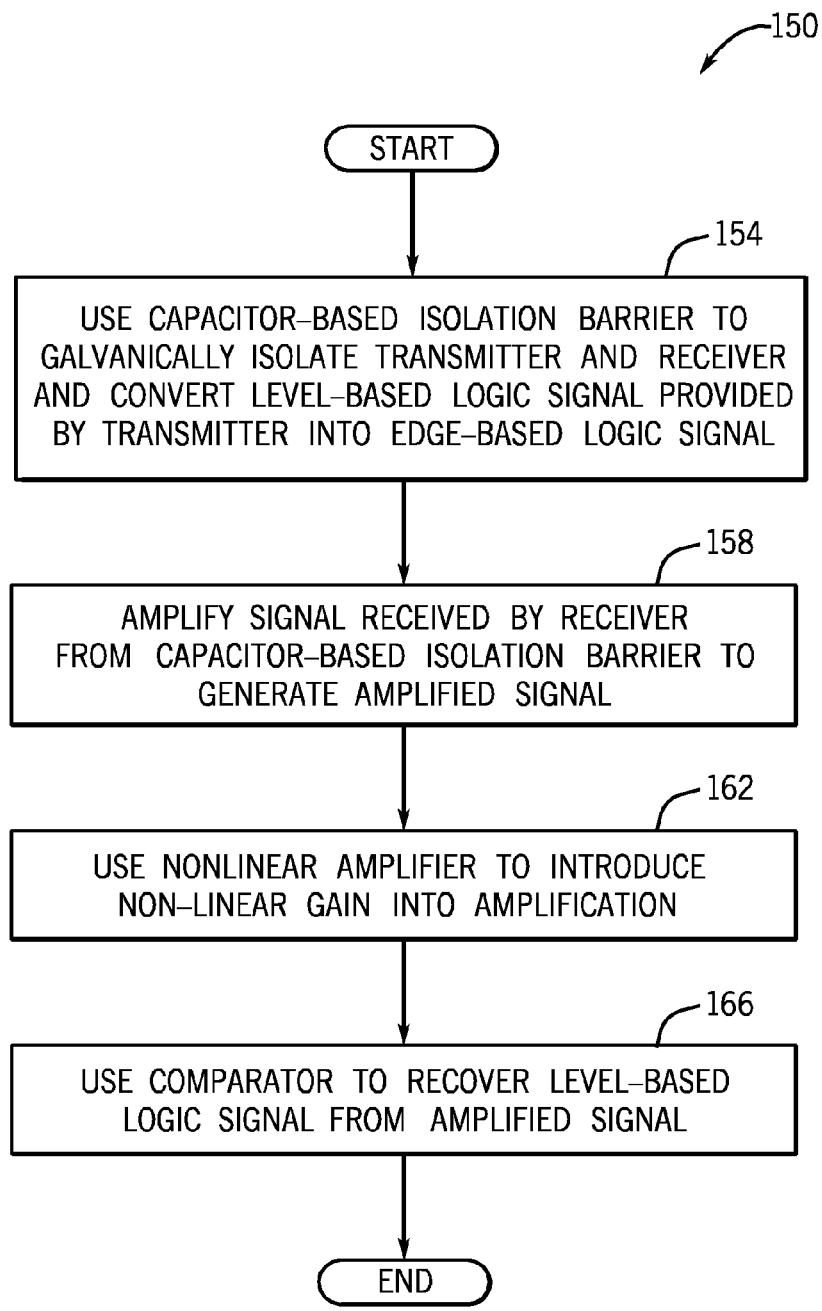
FIG. 9 is a flow diagram depicting a technique to enhance a signal-to-noise ratio and common mode transient immunity of an isolation receiver according to an exemplary embodiment.

In accordance with some embodiments, the comparator 98 may be a comparator that exhibits hysteresis, such as a Schmitt trigger, for example. In this manner, the Schmitt trigger changes the $V_{OUT}$ signal from a logic zero level to a logic one level in response to the $V_{OUT\_AM}$ signal exceeding an upper threshold level (i.e., in response to the Schmitt trigger receiving a positive differential pulse); and the Schmitt trigger changes the $V_{OUT}$ signal from a logic one level to a logic zero level in response to the $V_{OUT\_AM}$ signal exceeding a lower threshold level (i.e., in response to the Schmitt trigger receiving a negative differential pulse). Another comparator, including a comparator selected from comparators that exhibit hysteresis and comparators that do not exhibit hysteresis, may alternatively be used for the comparator 98, in accordance with further embodiments. Thus, referring to FIG. 9, in accordance with exemplary embodiments, a technique 150 includes using (block 154) a capacitor-based isolation barrier to galvanically isolate a transmitter and a receiver. The technique 150 includes amplifying (block 158) a signal that is received by the receiver from the capacitor-based isolation barrier to generate an amplified signal. As described herein, a nonlinear amplifier may be used to apply a nonlinear function to introduce a non-linear gain into the amplification, pursuant to block 162. The technique 150 further includes using (block 166) a comparator to recover a level-based logic signal from the amplified pulses.

Figure 10:
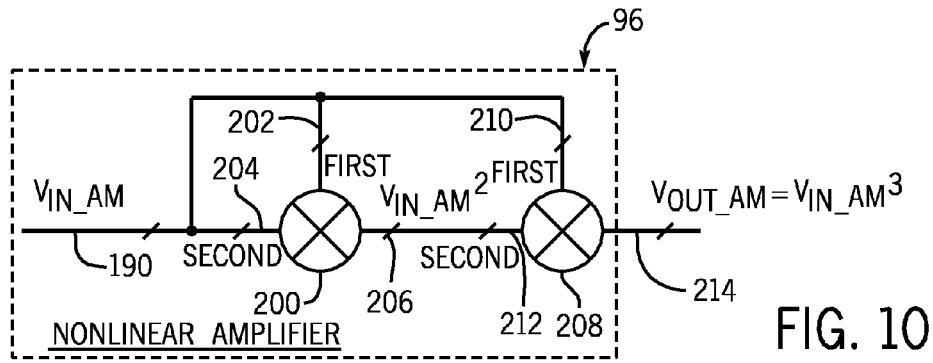
FIGS. 10 and 11 are schematic diagrams of nonlinear amplifiers that may be used in an isolation receiver according to exemplary embodiments.

Referring to FIG. 10, as a more specific example, in accordance with exemplary embodiments, the nonlinear amplifier 96 may include two analog multiplier cells 200 and 208, which are arranged, or coupled together, to apply a non-linear gain function to a signal (called "$V_{IN\_AM}$" in FIG. 10) that is received at input terminals 190 of the nonlinear amplifier 96 to produce a signal (called "$V_{OUT\_AM}$" in FIG. 10) at output terminals 214 of the nonlinear amplifier 96. Depending on the particular embodiment, the nonlinear amplifier 96 applies a nonlinear function of the form $V_{OUT\_AM} = V_{IN\_AM}^N$ to the $V_{IN\_AM}$ signal, where "N" represents an odd integer that is greater than or equal to three. In accordance with exemplary embodiments, "N" is selected to be odd to preserve the polarity of the $V_{IN\_AM}$ input signal (i.e., for purposes of ensuring that the polarity at the output of the nonlinear amplifier 96 follows the polarity at the input of the nonlinear amplifier 96). In accordance with exemplary embodiments that are disclosed herein, N is three, or $V_{OUT\_AM} = V_{IN\_AM}^3$, as depicted in FIG. 10.

In accordance with exemplary embodiments that are disclosed herein, the analog multiplier cell 200, 208 is a three port device, which has an output port that provides a signal that represents the product of signals that are received at the two input ports of the analog multiplier cell. As depicted in FIG. 10, the analog multiplier cell 200, 208 has a first port (depicted by input terminals 202 of the analog multiplier cell 200) and a second port 204 (depicted by input terminals 204 of the analog multiplier cell 200). As an example, in accordance with some implementations, the analog multiplier cell 200, 208 may be a Gilbert cell that is frequently used in frequency mixing applications in which the cell multiplies a local oscillator (LO) signal (periodic signal, such as a sinusoid or a square wave, for example) that is received at the first input port with a radio frequency (RF) or intermediate frequency (IF) signal (such as a signal received as a result of a wireless transmission, for example) at the second input port to produce an output signal that contains sum and difference frequencies for purposes of upconverting or downconverting the RF/IF signal.

As used in the isolator 20, the first and second input ports of the analog multiplier cells 208 and 200 are coupled in a manner that produces the $V_{OUT\_AM}$ output signal at the output terminals 214 of the nonlinear amplifier 96, which is a non-linear function of the $V_{IN\_AM}$ input signal that is received at the input terminals 190 of the nonlinear amplifier 96.

Turning now to the specific example embodiment that is depicted in FIG. 10, output terminals 206 (i.e., the output port) of the analog multiplier cell 200 provides a signal (called "$V_{IN\_AM}^2$" in FIG. 10), which is the square of the $V_{IN\_AM}$ input signal. As depicted in FIG. 10, the input terminals 202 of the analog multiplier cell 200 (which corresponds to its second input port) are coupled to input terminals 204 of the analog multiplier cell 200 (which corresponds to its first input port); and the input terminals 190 of the nonlinear amplifier 96 are coupled to the first and second input ports of the analog multiplier cell 200.

The analog multiplier cell 208 performs an additional multiplication for purposes of converting the $V_{IN\_AM}^2$ signal into the $V_{IN\_AM}^3$ signal that appears at the nonlinear amplifier's output terminals 214, i.e., the analog multiplier cell 208 multiplies the $V_{IN\_AM}$ input signal with the $V_{IN\_AM}^2$ signal. One way to accomplish this is by coupling the first input ports of the analog multiplier cells 200 and 208 together and coupling the second input port of the analog multiplier cell 208 to the output port of the analog multiplier cell 200, as depicted in FIG. 10.

Figure 13:
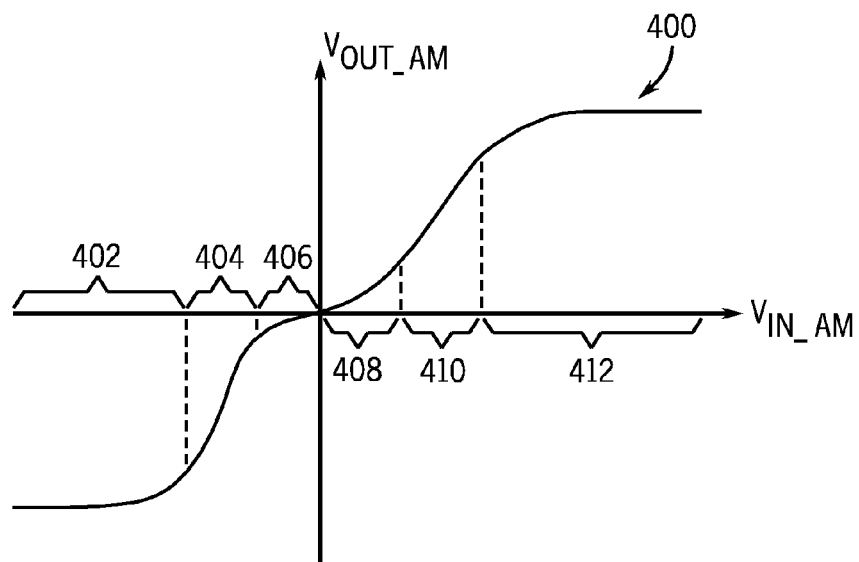
FIG. 13 depicts an output voltage versus input voltage relationship of a nonlinear amplifier of FIG. 10 according to an exemplary embodiment.

Referring to FIG. 13 in conjunction with FIG. 10, the $V_{OUT\_AM}$ signal may vary with the $V_{IN\_AM}$ signal according to a transfer function 400. As depicted in FIG. 13, the transfer function 400 has nonlinear cubic regions 406 and 408 in which the $V_{OUT\_AM}$ signal varies according to $V_{IN\_AM}^3$. In this manner, the nonlinear amplifier 96 uses all three regions to achieve the desired nonlinearity. That is, for a relatively small input signal amplitude, a cubic function is applied, and for a relatively moderate input signal amplitude, a linear function is applied. For a relatively large input signal amplitude, the amplifier's output is saturated. As also depicted in FIG. 13, the transfer function 400 may include other regions in which the $V_{OUT\_AM}$ signal varies differentially, such as regions 404 and 410 in which the $V_{OUT\_AM}$ signal varies nearly linearly with respect to the $V_{IN\_AM}$ signal and regions 402 and 412 in which the analog multiplier's devices are saturated, thereby causing the $V_{OUT\_AM}$ signal to be relatively constant with respect to the $V_{IN\_AM}$ signal.

Figure 11:
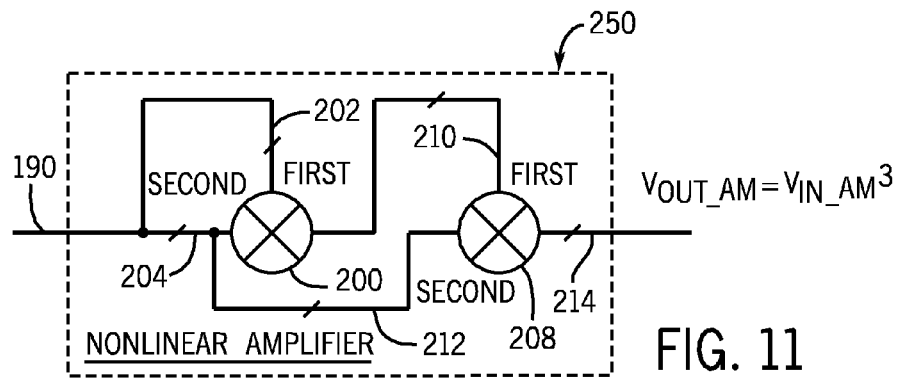

The nonlinear amplifier 96 may be replaced, in further embodiments, by a nonlinear amplifier 250 (see FIG. 11) that couples the analog multiplier cells 200 and 208 together in a different configuration to convert the $V_{IN\_AM}^2$ signal into the $V_{IN\_AM}^3$ signal. Referring to FIG. 11, for these embodiments, the RF input port of the analog multiplier cell 208 is coupled to the second input port of the analog multiplier cell 208; and the first input port of the analog multiplier cell 208 is coupled to the output port of the analog multiplier cell 200.

Figure 12:
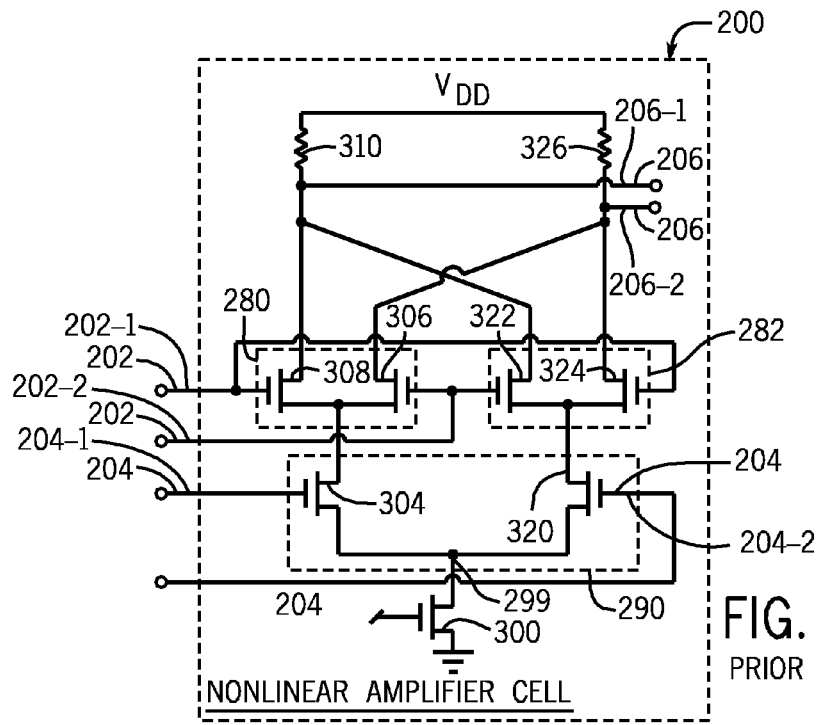
FIG. 12 is a schematic diagram of a Gilbert cell.
Figure 14:
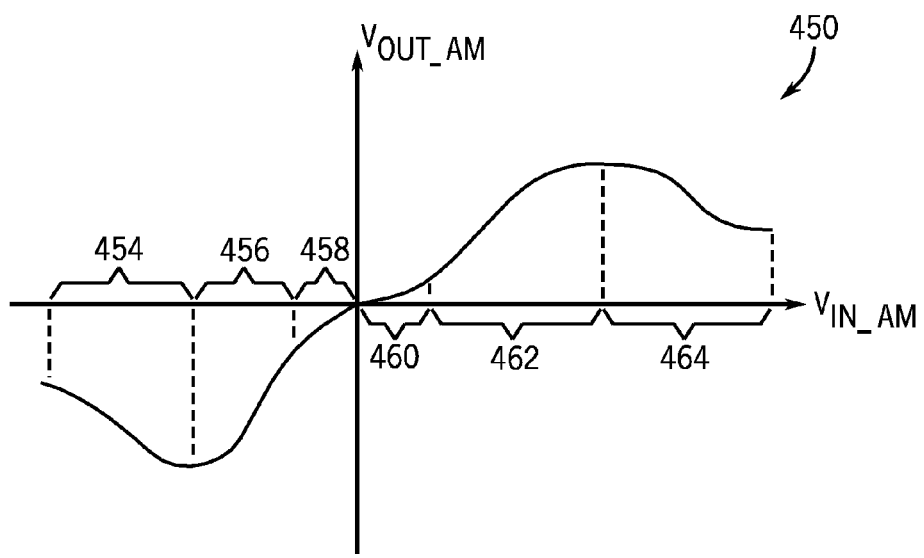
FIG. 14 depicts an output voltage versus input voltage relationship of a nonlinear amplifier of FIG. 11 according to an exemplary embodiment.

Referring to FIG. 14 in conjunction with FIG. 11, the $V_{OUT\_AM}$ signal of the nonlinear amplifier 250 may vary with the $V_{IN\_AM}$ signal according to a transfer function 450. As depicted in FIG. 14, similar to the transfer function 400 (FIG. 13) for the nonlinear amplifier 96, the transfer function 450 has nonlinear cubic regions 458 and 460 in which the $V_{OUT\_AM}$ signal varies according to $V_{IN\_AM}^3$ signal. Moreover, as also depicted in FIG. 14, the transfer function 460 may include regions 456 and 462 in which the $V_{OUT\_AM}$ signal varies nearly linearly with respect to the $V_{IN\_AM}$ signal. Unlike the transfer function 400, the transfer function 450 includes regions 454 and 464 in which the nonlinear amplifier 250 exhibits further nonlinear behavior As a non-limiting example, in accordance with some embodiments, the analog multiplier cell 200, 208 may share a similar design. Using the analog multiplier cell 200 as an example, the analog multiplier cell 200 may be a Gilbert cell that is depicted in FIG. 12. In general, the Gilbert cell is an analog, four quadrant multiplier that multiplies the input signal on the first second port with the input signal on the second input port. The cell 200 includes differential amplifier stages 280 and 282. The currents in the differential amplifier stages 280 and 282 are controlled by another differential amplifier stage 290 that amplifies the signal that appears at the second port of the cell.

For the example embodiment that is depicted in FIG. 12, the Gilbert cell is a complementary metal-oxide-semiconductor (CMOS) circuit. For this exemplary embodiment, the differential amplifier stage 290 includes metal-oxide-semiconductor field-effect-transistors (MOSFETs) 304 and 320 that have source terminals that are coupled together at a node 299. The drain-to-source current path of a tail current bias adjusting MOSFET source 300 is coupled between the node 299 and ground. The gate terminals of the MOSFETs 304 and 320 receive the signal that appears on the second input port. More specifically, the gate terminal of the MOSFET 304 is coupled to a positive second port input terminal 204-1, and the gate terminal of the MOSFET 320 is coupled to a negative second port input terminal 204-2, so that the signal at the RF port appears across the gate terminals of the MOSFETs 304 and 320. The drain terminal of the MOSFET 304 is coupled to the source terminals of MOSFETs 306 and 308 of the differential amplifier 280; and the drain terminal of the MOSFET 320 is coupled to the source terminals of MOSFETs 322 and 324 of the differential amplifier 282.

The differential amplifier 280 is formed from a differential pair of MOSFETs 306 and 308. The gate terminal of the MOSFET 308 is coupled to a positive first input port terminal 202-1. The drain terminal of the MOSFET 308 is coupled through a load resistor 310 to a positive voltage supply (called "$V_{DD}$" in FIG. 12) and provides the signal that appears at the positive output terminal 206-1. The gate terminal of the MOSFET 306 is coupled to the negative first input port terminal 202-2, and the drain terminal of the MOSFET 306 is coupled to the negative output terminal 206-2. The source terminals of the MOSFETs 306 and 308 are coupled together and coupled to the drain terminal of the MOSFET 304.

The differential amplifier 282 is formed from a differential pair of MOSFETs 322 and 324. The gate terminal of the MOSFET 324 is coupled to the first input port terminal 202-1, and the drain terminal of the MOSFET 324 is coupled through a load resistor 326 to the $V_{DD}$ positive supply voltage. The drain terminal of the MOSFET 324 provides the signal for the output terminal 206-2 and as such, is also coupled to the drain terminal of the MOSFET 306. The gate terminal of the MOSFET 324 is coupled to the negative first input port terminal 202-1 and to the gate terminal of the MOSFET 306. The drain terminal of the MOSFET 322 is coupled to the positive output terminal 206-1 for the cell. The source terminals of the MOSFETs 322 and 324 are coupled together and coupled to the drain terminal of the MOSFET 320.

The analog multiplier cell 208 may have a design similar to the analog multiplier cell 200, in accordance with example embodiments.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. An isolation receiver comprising:
   at least one isolation capacitor to provide a first logic signal in response to a second logic signal that is provided by a transmitter;
   a signal processing circuit to generate a transformed signal, wherein the transformed signal comprises a magnitude range in which a magnitude of the transformed signal is a nonlinear function of a magnitude of the first logic signal; and
   a comparator to provide a third logic signal in response to a comparison of the transformed signal in the magnitude range.

2. The isolation receiver of claim 1, wherein the signal processing circuit comprise an amplifier.

3. The isolation receiver of claim 2, wherein the amplifier comprises:
   a first analog multiplier cell comprising:
      an output port to provide an output signal for the first analog multiplier cell;
      a first input port; and
      a second input port; and
   a second analog multiplier cell comprising:
      an output port to provide an output signal for the second analog multiplier cell;
      a first input port; and
      a second input port,
   wherein the first and second input ports of the first analog multiplier cell are coupled together, the first input port of the second analog multiplier cell is coupled to the output port of the first analog multiplier cell, and the second input port of the second analog multiplier cell is coupled to the first and second input ports of the first analog multiplier cell.

4. The isolation receiver of claim 3, wherein the first input ports of the first and second analog multiplier cells comprise radio frequency (RF) input ports of mixer cells, and the second input ports of the first and second analog multiplier cells comprise local oscillator (LO) input ports of mixer cells.

5. The isolation receiver of claim 2, wherein the amplifier comprises:
   a first analog multiplier cell comprising:
      an output port to provide an output signal for the first analog multiplier cell;
      a first input port; and
      a second input port; and
   a second analog multiplier cell comprising:
      an output port to provide an output signal for the second analog multiplier cell;
      a first input port; and
      a second input port,
   wherein the first and second input ports of the first analog multiplier cell are coupled together, the first input port of the second analog multiplier cell is coupled to the first and second input ports of the first analog multiplier cell, and the second input port of the second analog multiplier cell is coupled to the output port of the first analog multiplier cell.

6. The isolation receiver of claim 5, wherein the first input ports of the first and second analog multiplier cells comprise radio frequency (RF) input ports of mixer cells, and the second input ports of the first and second analog multiplier cells comprise local oscillator (LO) input ports of mixer cells.

7. The isolation receiver of claim 1, wherein the signal processing circuit comprises at least one Gilbert cell.

8. The receiver of claim 1, wherein the comparator comprises a Schmitt trigger.

9. The receiver of claim 1, wherein the signal processing circuit comprises a plurality of analog multiplier cells coupled together.

10. A method comprising:
    receiving a first logic signal from at least one isolation capacitor, the first signal being indicative of logical transitions of a second logic signal provided to the at least one isolation capacitor by a transmitter;
    applying a nonlinear function to the first logic signal to generate a transformed signal, the applying comprising using an amplifier, wherein applying the nonlinear function comprises using at least two analog multiplier cells to generate a nonlinear gain; and
    generating another logic signal in response to the transformed signal.

11. The method of claim 10, wherein using the at least two mixer cells comprises coupling input terminals of at least one of the mixer cells together.

12. The method of claim 10, wherein using the at least two analog multiplier cells comprises coupling local oscillator (LO) input ports of the mixer cells together.

13. The method of claim 10, wherein using the at least two analog multiplier cells comprises coupling radio frequency (RF) input ports of the mixer cells together.

14. The method of claim 10, wherein applying the nonlinear function comprises introducing a nonlinearity to the first logic signal.

15. An apparatus comprising:
an integrated circuit comprising at least one isolation capacitor and an amplifier,
wherein the at least one galvanic isolation capacitor provides a first signal indicative of logical transitions of a second signal, the amplifier is adapted to apply a nonlinear function to the first signal, and the amplifier comprises at least two analog multiplier cells adapted to introduce a nonlinearity to the first signal.

16. The apparatus of claim 15, further comprising a transmitter to provide the second signal to the at least one galvanic isolation capacitor.

17. The apparatus of claim 15, further comprising at least one low noise amplifier to introduce a gain to the first signal.

18. The apparatus of claim 15, wherein the amplifier comprises at least one Gilbert cell.

19. An isolation receiver comprising:
at least one isolation capacitor to provide a first logic signal in response to a second logic signal that is provided by a transmitter;
a signal processing circuit comprising a Gilbert cell to apply a nonlinear function to the first logic signal to generate a transformed signal; and
a comparator to provide a third logic signal in response to the transformed signal.

* * * * *